US009293226B2

(12) United States Patent
Baek et al.

(10) Patent No.: US 9,293,226 B2
(45) Date of Patent: Mar. 22, 2016

(54) MEMORY TEST DEVICE AND OPERATING METHOD THEREOF

(71) Applicant: Samsung Electronics Co., Ltd., Suwon-si (KR)

(72) Inventors: Jae Hyun Baek, Suwon-si (KR); Jae Moo Choi, Suwon-si (KR); Jae Hee Han, Seoul (KR); In Su Yang, Seongnam-si (KR); Hyun Soo Jung, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/341,856

(22) Filed: Jul. 28, 2014

(65) Prior Publication Data
US 2015/0100838 A1 Apr. 9, 2015

(30) Foreign Application Priority Data
Oct. 7, 2013 (KR) ........................ 10-2013-0119364

(51) Int. Cl.
*G11C 29/00* (2006.01)
*G11C 29/56* (2006.01)

(52) U.S. Cl.
CPC ................................ *G11C 29/56004* (2013.01)

(58) Field of Classification Search
CPC ............. G11C 29/56004; G11C 29/36; G01R 31/31813; G01R 31/31921
See application file for complete search history.

(56) References Cited

U.S. PATENT DOCUMENTS

| 6,484,282 | B1* | 11/2002 | Tsuto | ............... | G01R 31/31813 714/718 |
| 7,302,623 | B2 | 11/2007 | Kang | | |
| 7,574,633 | B2 | 8/2009 | Sato et al. | | |
| 8,001,439 | B2 | 8/2011 | Ong | | |
| 2012/0250433 | A1 | 10/2012 | Jeon | | |
| 2013/0015915 | A1* | 1/2013 | Komatsu | ................ | G11C 29/48 327/564 |

FOREIGN PATENT DOCUMENTS

| EP | 01204876 | 4/2003 |
| JP | 5038256 | 10/2012 |
| KR | 10-0506772 | 8/2005 |
| KR | 10-0540506 | 12/2005 |
| KR | 10-2006-0048345 | 5/2006 |

(Continued)

OTHER PUBLICATIONS

Takashi Itoh, "MTP: New memory test solution enabled by software for true per-pin test processor architecture system." Verigy.

(Continued)

*Primary Examiner* — Guerrier Merant
(74) *Attorney, Agent, or Firm* — Muir Patent Law, PLLC

(57) ABSTRACT

A memory test device for testing a memory device is provided. The memory test device includes a sequencer configured to output first and second sequencer outputs that are different from each other in response to a sequencer input. A first pattern generator is configured to output a first test pattern according to the first sequencer output. A second pattern generator is configured to output a second test pattern according to the second sequencer output. A selector is coupled to the first and second pattern generators and configured to output write data according to the first test pattern and the second test pattern.

20 Claims, 13 Drawing Sheets

(56) References Cited

FOREIGN PATENT DOCUMENTS

| | | |
|---|---|---|
| KR | 10-0853403 | 8/2008 |
| KR | 10-0858651 | 9/2008 |
| KR | 10-0922422 | 10/2009 |
| KR | 10-2013-0000758 | 1/2013 |
| KR | 10-2013-0001673 | 1/2013 |

OTHER PUBLICATIONS

Offerman et al., "An Open Notation for Memory Tests." Delft University of Technology.

International Technology Roadmap for Semiconductors, Test and Test Equipment. 2009 Edition.

\* cited by examiner

FIG. 5

Sequencer Memory

| SEQ_ADD | SEQ_CMD |
|---------|---------|
| 0 | NOP0 |
| 1 | NOP1 |
| 2 | LOOP |

Latency Memory

| SEQ_ADD | NUM_INFO |
|---------|----------|
| 0 | 5 |
| 1 | 4 |
| 2 | 3 |

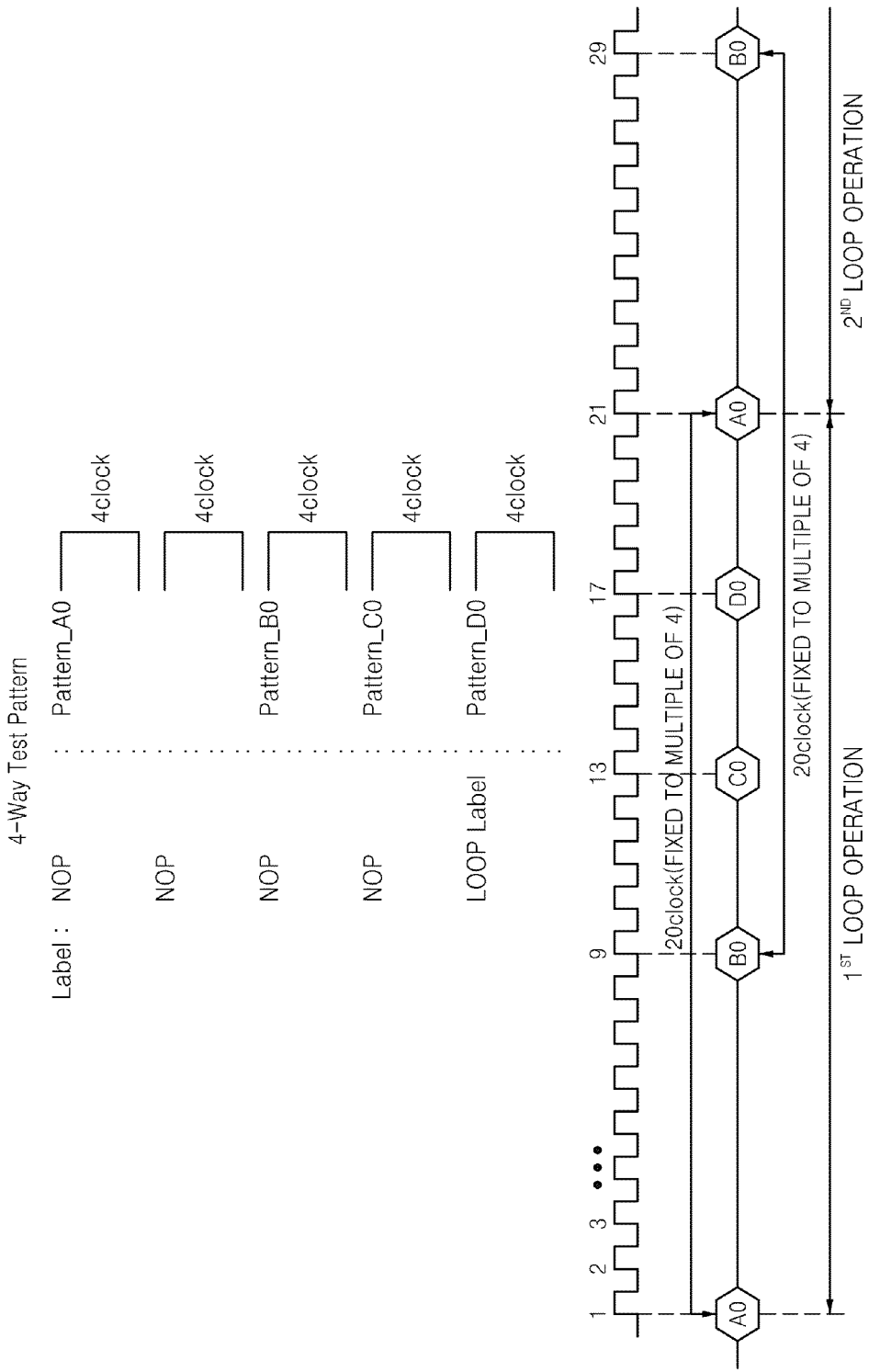

MEMORY TEST DEVICE AND OPERATING METHOD THEREOF

CROSS-REFERENCE TO RELATED APPLICATIONS

This application claims the benefit of Korean Patent Application No. 10-2013-0119364, filed on Oct. 7, 2013, in the Korean Intellectual Property Office, the disclosure of which is incorporated herein in its entirety by reference.

BACKGROUND

Automatic test equipment (ATE) is generally an apparatus or system that performs tests on a device under test (DUT) to detect defects or errors in the DUT in an automated fashion. ATE may be used for memory testing to detect faults caused by an error in a memory manufacturing process in various ways, for example through the use of ATE prior to completion of memory chip packaging to detect errors such as defective passive elements. In memory test equipment such ATE, a test pattern may be reproduced using an algorithmic pattern generator (ALPG) to test a memory. For memory testing, ALPG test patterns are used by the ATE to detect defects or errors in the DUT.

Mount testing generally refers to testing a DUT that has been installed or mounted, such as memory device or chip that has been mounted on a printed circuit board (PCB) in a memory module. In mount testing, a test application may be loaded into a processor to test the memory. Mount testing may be used to detect or identify various problems, such as poor operating characteristics and/or defective active elements in the DUT. Mount testing may differ from testing an un-mounted device, such as a semiconductor memory device on a wafer or in an un-mounted package, because the semiconductor memory devices may be operating.

Test equipment can be expensive, such as ATE costing millions of dollars. There can be benefits from improvements to test equipment and test methods, for example enabling or expanding or speeding up the automated test of devices such as high-speed memories. Enabling ATE to provide high speed automated testing that otherwise may be performed using mount testing, which generally is slower than ATE testing, can provide significant benefits such as providing for improved quality and decreased costs for semiconductor memory devices.

SUMMARY

Embodiments disclosed herein provide a memory test device with expanded test coverage and an operating method thereof.

In some embodiments, a memory test device for testing a memory device includes a sequencer configured to output first and second sequencer outputs that are different from each other in response to a sequencer input. A first pattern generator is coupled to the first sequencer output and configured to output a first test pattern according to the first sequencer output. A second pattern generator is coupled to the second sequencer output and configured to output a second test pattern according to the second sequencer output. A selector is coupled to the first and second pattern generators and configured to output write data according to the first test pattern and the second test pattern.

The first pattern generator and the second pattern generator may operate in parallel. Same test patterns may be stored in the first pattern generator and the second pattern generator.

The first and second sequencer outputs may be first and second pattern memory addresses. The sequencer may comprise a command analyzer configured to receive and execute a sequencer command. A pattern address generator may be configured to generate the first and second pattern memory addresses.

In some embodiments a sequencer memory is configured to store the sequencer command, and a latency memory is configured to store information related to a number of pattern commands. The pattern address generator may be configured to generate the first and second pattern memory addresses according to a sequencer memory address and the number of pattern commands. In various embodiments, the number of pattern commands varies according to the sequencer memory address. The pattern address generator may be configured to output a number of pattern memory addresses equal to the number of the pattern commands, and to transmit an enable signal to the command analyzer. The command analyzer may be configured to update the sequencer memory address according to the sequencer command and to output the updated sequencer memory address according to the enable signal.

Each of the first pattern generator and the second pattern generator may be configured to discontinuously store a plurality of test patterns when a number of pattern commands is less than 7. The sequencer may be configured to store in the latency memory a value obtained by subtracting 1 from the number of the pattern commands.

In some embodiments, the sequencer command varies according to an external input. The number of the pattern commands may vary according to an external input. Embodiments may include a pattern comparator configured to compare data read from the memory device with the write data to determine whether the memory device operates normally.

In various embodiments, a method of operating a memory test device to test a memory device may comprise outputting in parallel a plurality of different sequencer outputs to a plurality of pattern generators, outputting in parallel from the plurality of pattern generators a plurality of test patterns that correspond to the plurality of different sequencer outputs, generating write data according to the plurality of test patterns, and outputting the write data to the memory device.

Outputting in parallel of the plurality of different sequencer outputs may include extracting a number of pattern commands corresponding to a sequencer memory address and generating a plurality of pattern memory addresses according to the sequencer memory address and the number of the pattern commands.

In various embodiments, the number of the pattern commands may vary based on the sequencer memory address. The method may include reading read data from the memory device and comparing the write data with the read data to determine whether the memory device operates normally.

According to embodiments, a memory test system includes a host configured to control a memory test device, a sequencer coupled to the host and configured to output first and second sequencer outputs that are different from each other in response to a sequencer input, first and second pattern generators respectively coupled to the first and second sequencer outputs and configured to provide respective first and second pattern outputs, and a selector coupled to the first and second pattern outputs and configured to provide output write data.

The sequencer may comprise a command analyzer configured to receive and execute a sequencer command and a pattern address generator configured to generate the first and second sequencer outputs. The sequencer may further comprise a sequencer memory configured to store the sequencer command and a latency memory configured to store information related to a number of pattern commands. The pattern address generator may be configured to generate first and second pattern memory addresses according to a sequencer memory address and the number of pattern commands.

BRIEF DESCRIPTION OF THE DRAWINGS

Exemplary embodiments will be more clearly understood from the following detailed description taken in conjunction with the accompanying drawings in which:

FIG. 5 is a table showing examples of values stored in a sequencer memory and a latency memory illustrated in FIG. 4;

FIG. 9A illustrates a cycle of executing pattern commands according to a test pattern of the 4-way ATE tester of FIG. 2A;

DETAILED DESCRIPTION OF THE EMBODIMENTS

Figure 1A:
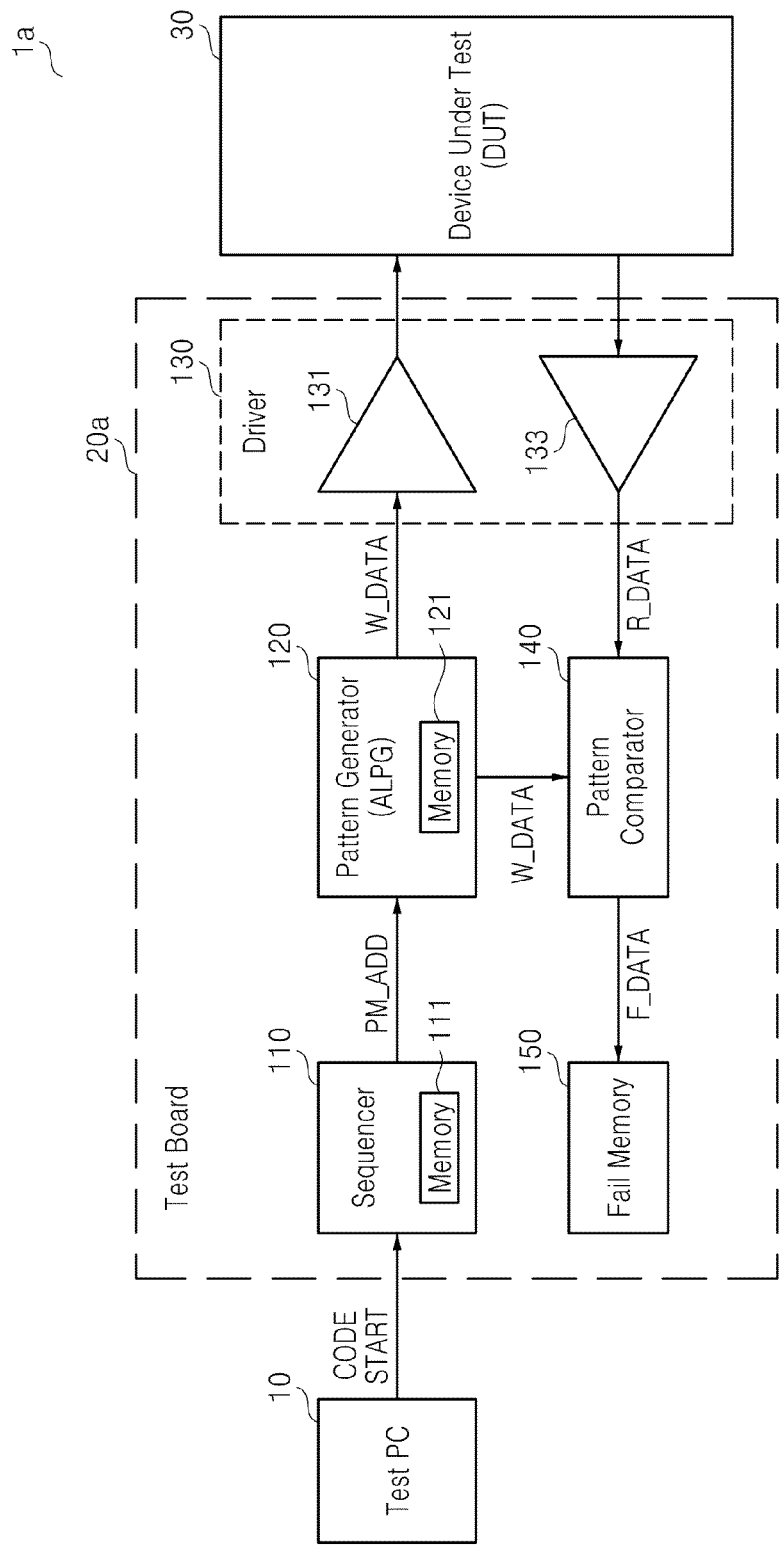
FIG. 1A is a block diagram of a conventional design of a 1-way automatic test equipment (ATE) tester that uses one pattern generator.

Embodiments now will be described more fully hereinafter with reference to the accompanying drawings. The inventions may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1B:
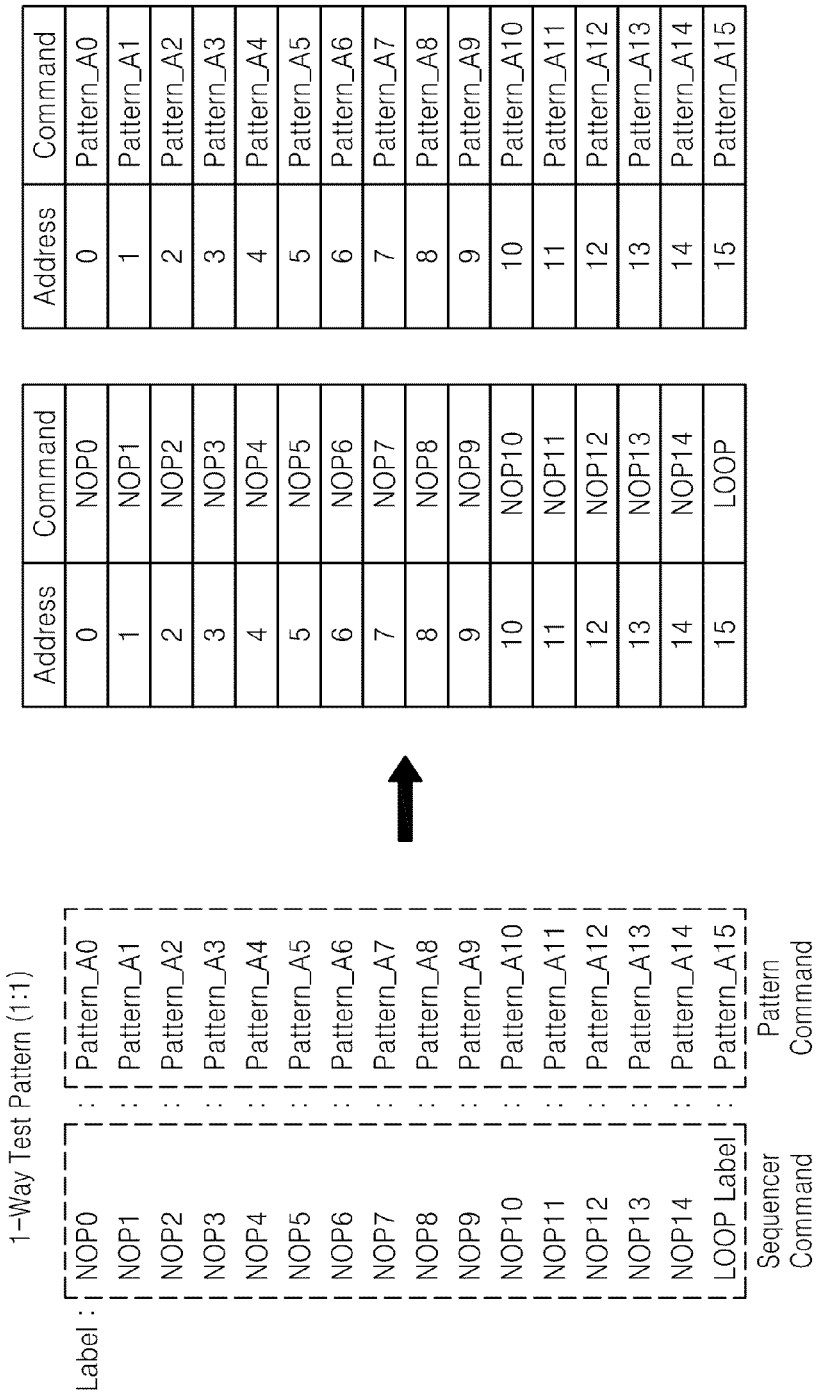
FIG. 1B illustrates a pattern storing manner employed by the 1-way ATE tester of FIG. 1A.

FIG. 1A is a block diagram of a conventional 1-way automatic test equipment (ATE) tester 20a that uses one pattern generator. FIG. 1B illustrates a possible pattern storing manner employed by the 1-way ATE tester 20a of FIG. 1A Referring to FIGS. 1A and 1B, a memory test system 1a may include a host 10, the 1-way ATE tester 20a, and a device-under-test (DUT) 30.

The host 10 (hereinafter referred to by way of example as 'test personal computer (PC)') may output code CODE corresponding to a desired test pattern to the 1-way ATE tester 20a. The test PC 10 may output a test start signal START to the tester 20a instructing to start testing the DUT 30.

The DUT 30 is a memory device to be tested, such as a dynamic random access memory (DRAM).

The 1-way ATE tester 20a may be mounted on a test board.

The 1-way ATE tester 20a may include a sequencer 110, a pattern generator (algorithmic pattern generator (ALPG)) 120, a driver 130, a pattern comparator 140, and a fail memory 150.

The sequencer 110 may control an order in which pattern commands are to be performed by the pattern generator 120.

The sequencer 110 may include a sequencer memory 111.

The sequencer 110 may extract sequencer commands, e.g., No-OPeration (NOP) commands, a LOOP command, etc., from the code CODE received from the test PC 10, and store the extracted sequencer commands in the sequencer memory 111.

When the sequencer 110 receives the test start signal START from the test PC 10, the sequencer 110 may execute the sequencer commands starting from a sequencer command stored at a preset start address, e.g., a $0^{th}$ address, of the sequencer memory 111. The sequencer 110 may generate pattern memory addresses PM_ADD by decoding the sequencer commands.

The pattern generator 120 may generate write data W_DATA for testing the DUT 30 by executing pattern commands corresponding to the pattern memory addresses PM_ADD received from the sequencer 110.

The pattern generator 120 may include a pattern memory 121.

The pattern generator 120 may store pattern commands Pattern_A0 to Pattern_A15 in the pattern memory 121 for use according to the code CODE received from the test PC 10.

The sequencer commands may correspond to the pattern commands, respectively. For example, a first sequencer command NOP0 to a sixteenth sequencer command LOOP may correspond to the first pattern commands Pattern_A0 to the sixteenth pattern command Pattern_A15, respectively.

The first sequencer command NOP0 to the sixteenth sequencer command LOOP may be stored at the $0^{th}$ address to a $15^{th}$ address of the sequencer memory 111, respectively. In this case, the sequencer 110 may sequentially execute the sequencer commands NOP0 to LOOP stored at the $0^{th}$ address to the $15^{th}$ address of the sequencer memory 111. The result of the LOOP command is that the sequencer 110 will then execute the sequencer commands NOP0 to LOOP again starting from the first sequencer command NOP0 stored at the $0^{th}$ address.

The first pattern command Pattern_A0 to the sixteenth pattern command Pattern_A15 may be stored at pattern memory addresses PM_ADD (e.g., a $0^{th}$ address to a $15^{th}$ address) of the pattern memory 121, respectively.

The sequencer 110 may execute a sequencer command at an $n^{th}$ address to generate a pattern memory address PM_ADD, and the pattern generator 120 may execute a pattern command Pattern_An stored at the pattern memory address PM_ADD to generate write data W_DATA. Here with reference to FIG. 1B, 'n' denote an integer that is equal to or greater than '0' and less than or equal to '15'.

The driver 130 may include a write driver 131 and a read driver 133.

The write driver 131 may write the write data W_DATA to the DUT 30.

The read driver 133 may read the read data R_DATA from the DUT 30.

The pattern comparator 140 may compare the write data W_DATA with the read data R_DATA to determine whether the DUT 30 operates normally or abnormally.

The pattern comparator 140 may output fail data F_DATA that is a result of comparing the write data W_DATA with the read data R_DATA to the fail memory 150. The fail data F_DATA may be data regarding an error occurring when the DUT 30 operates abnormally.

The 1-way ATE tester 20a reproduces a test pattern at a relatively low speed and is thus not capable of testing memories that operate at high speeds. Also, the 1-way tester 20a generally has limited test coverage for each test pattern.

Figure 2A:
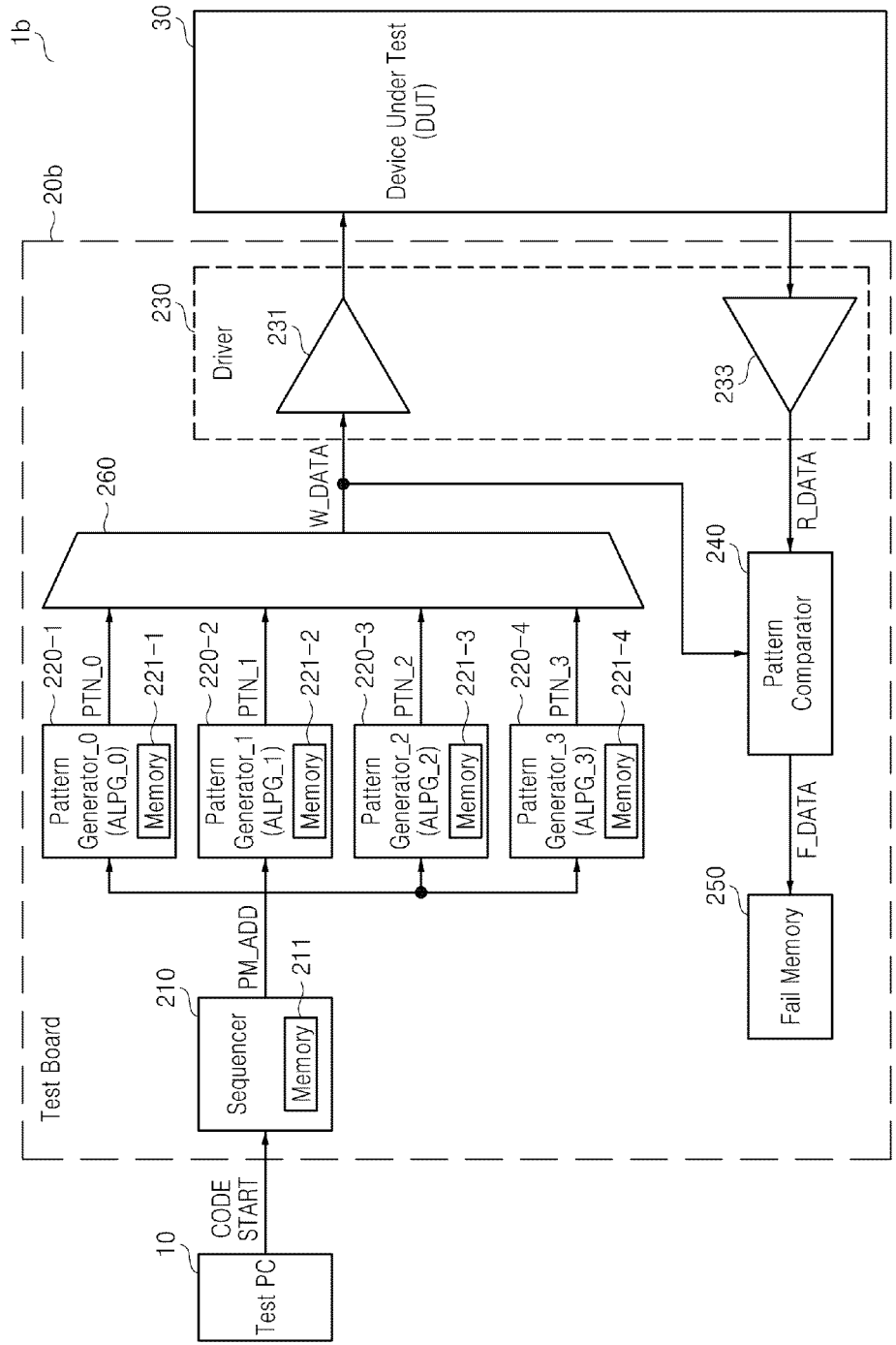
FIG. 2A is a block diagram of a conventional approach for a 4-way ATE tester that uses four pattern generators.
Figure 2B:
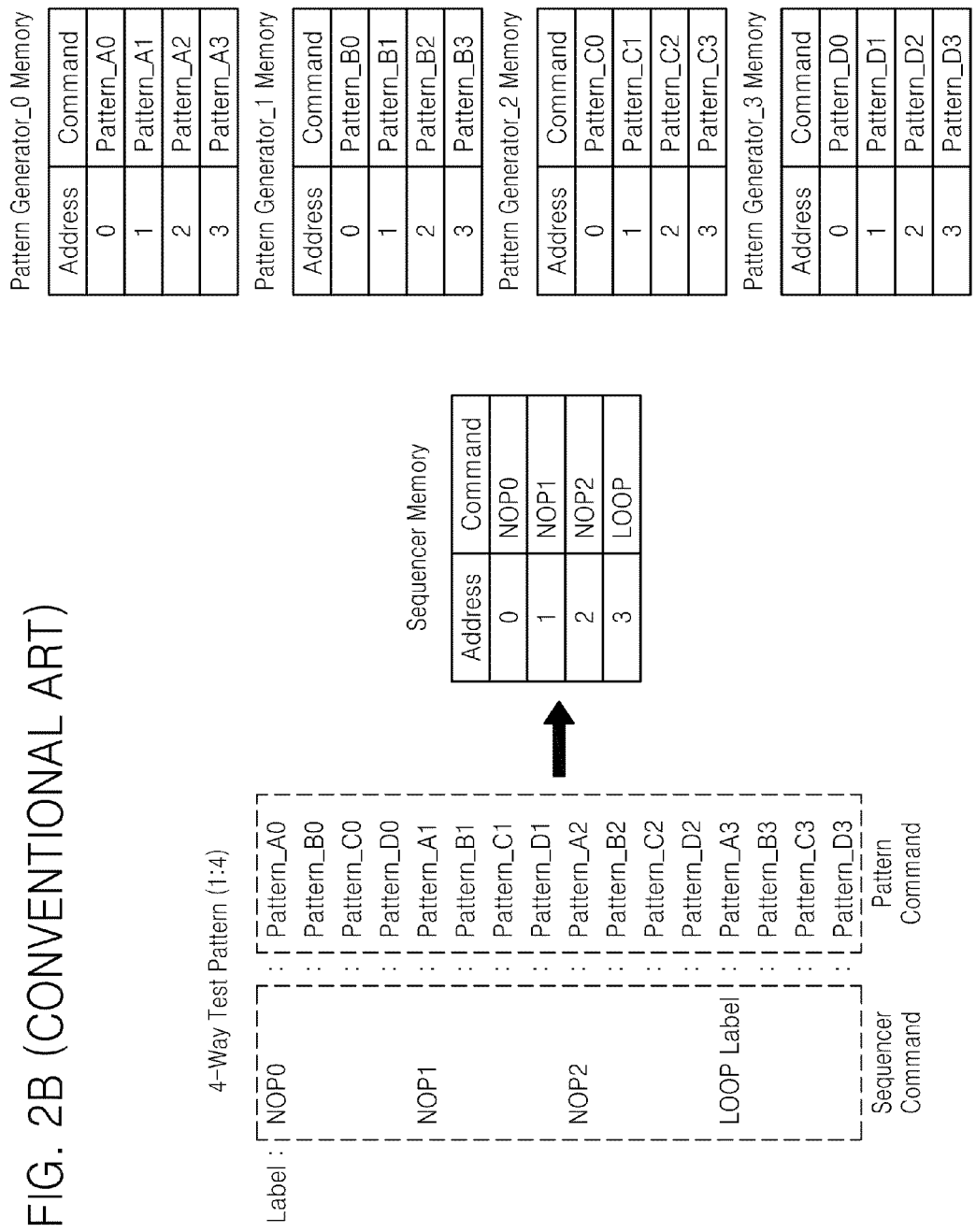
FIG. 2B illustrates a pattern storing manner employed by the 4-way ATE tester of FIG. 2A.

FIG. 2A is a block diagram of a conventional 4-way ATE tester 20b that uses four pattern generators. FIG. 2B illustrates a possible pattern storing manner employed by the 4-way ATE tester 20b of FIG. 2A. A structure of the 4-way ATE tester 20b of FIG. 2A is substantially the same as the structure of the 1-way ATE tester 20a and will be thus described focusing on the differences with the 1-way ATE tester 20a for convenience of explanation.

The tester 20b may include four pattern generators 220-1 to 220-4 and a write data generator 260. The pattern generators 220-1 to 220-4 may include pattern memories 221-1 to 221-4, respectively.

Each sequencer command may correspond to four pattern commands. For example, a first sequencer command NOP0 may correspond to an A0 pattern command Pattern_A0, a B0 pattern command Pattern_B0, a C0 pattern command Pattern_C0, and a D0 pattern command Pattern_D0.

The first sequencer command NOP0 may be stored at a $0^{th}$ address of a sequencer memory 211, and the A0 pattern command Pattern_A0, the B0 pattern command Pattern_B0, the C0 pattern command Pattern_C0, and the D0 pattern command Pattern_D0 may be stored at $0^{th}$ addresses of the pattern memories 221-1 to 221-4, respectively.

A sequencer 210 may execute the first sequencer command NOP0 and output a $0^{th}$ address as a pattern memory address PM_ADD.

The pattern generators 220-1 to 220-4 may execute the A0 pattern command Pattern_A0, the B0 pattern command Pattern_B0, the C0 pattern command Pattern_C0, and the D0 pattern command Pattern_D0 stored at the $0^{th}$ addresses of the pattern memories 221-1 to 221-4 according to the pattern memory address PM_ADD so as to generate a first test pattern PTN_0, a second test pattern PTN_1, a third test pattern PTN_2, and a fourth test pattern PTN_3.

The write data generator 260 may be embodied as a multiplexer to select between test pattern inputs. The multiplexer 260 may generate write data W_DATA by sequentially selecting the first test pattern PTN_0, the second test pattern PTN_1, the third test pattern PTN_2, and the fourth test pattern PTN_3.

The performance of the 4-way ATE tester 20b may be four times higher than the performance of the 1-way ATE tester 20a when sequencers 110, 210 operate at the same relative speed by setting an operating speed of the multiplexer 260 to be four times higher than operating speeds of the pattern generators 220-1 to 220-4. However, the 4-way ATE tester 20b is capable of executing sequencer commands only in units of four clocks and thus a test pattern generation cycle is set to only a multiple of 4, e.g., four clocks, eight clocks, etc., when repetitive sequencer commands such as a loop are executed.

Consequently, with the embodiment of FIG. 2A, it is impossible to set a cycle of executing pattern commands to a value other than a multiple of 4. Thus, a test pattern that is identical with a mounting environment may be difficult or impossible to generate, and test coverage may consequently decrease. Also, N/4 test patterns are allocated to each of the pattern memories 221-1 to 221-4 of the pattern generators 220-1 to 220-4 among whole test patterns N, and each of the pattern generators 220-1 to 220-4 cannot execute test patterns other than the N/4 test patterns allocated thereto.

Figure 3:
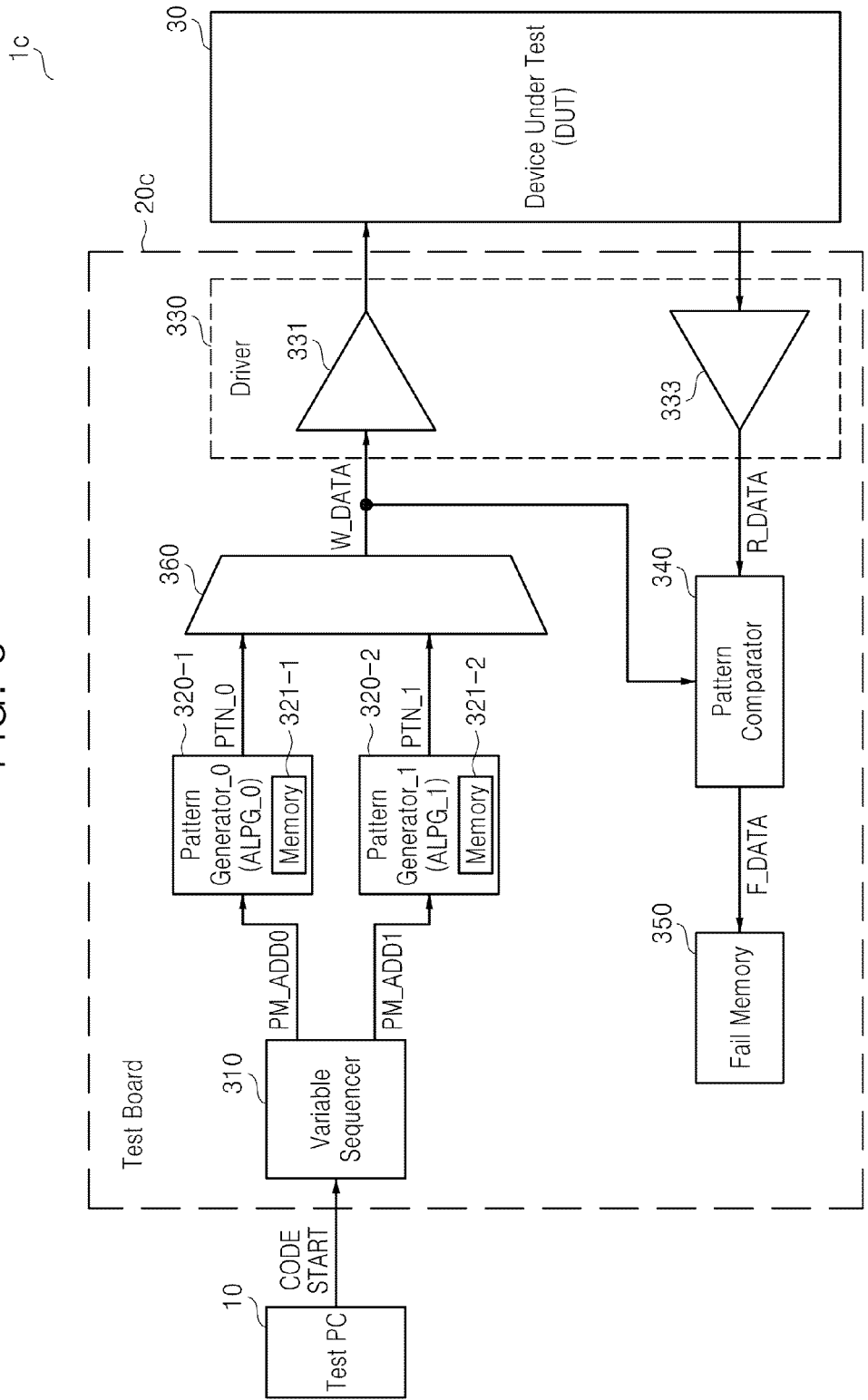
FIG. 3 is a block diagram of an ATE tester according to an embodiment.

FIG. 3 is a block diagram of an embodiment of an ATE tester 20c according to aspects of the inventions. Some structure of the ATE tester 20c of FIG. 3 may be substantially the same as the structure of the 4-way ATE tester 20b of FIG. 2B. ATE tester 20c will now be described with a focus on the differences with the 4-way ATE tester 20b for convenience of explanation.

A memory test system 1c may include a host such as test PC 10, the ATE tester 20c, and a DUT 30.

The test PC 10 may output code CODE corresponding to a desired test pattern to the ATE tester 20c. The test PC 10 may also output a test start signal START instructing the ATE tester 20c to start testing the DUT 30. The DUT 30 is a memory device to be tested, such as a DRAM.

The ATE tester 20c may be mounted on a test board. and may include a variable sequencer 310, a first pattern generator 320-1, a second pattern generator 320-2, and a write data generator 360.

The variable sequencer 310 may control an order in which pattern commands are to be executed by the first and second pattern generators 320-1 and 320-2. The variable sequencer 310 may output a first pattern memory address PM_ADD0 and a second pattern memory address PM_ADD1 which are different from each other.

The first pattern generator 320-1 may output a first test pattern PTN_0 according to the first pattern memory address PM_ADD0.

The second pattern generator 320-2 may output a second test pattern PTN_1 according to the second pattern memory address PM_ADD1.

The first pattern generator 320-1 may include a first pattern memory 321-1, and a second pattern generator 320-2 may include a second pattern memory 321-2. The first pattern generator 320-1 and the second pattern generator 320-2 may operate in parallel.

The write data generator 360 may generate and output write data W_DATA according to selecting from the first test pattern PTN_0 and the second test pattern PTN_1.

The first pattern generator 320-1 and the second pattern generator 320-2 may operate at an operating speed that is twice an operating speed of the variable sequencer 310. The write data generator 360 may operate at an operating speed that is four times the operating speed of the variable sequencer 310. In this example configuration, the ATE tester 20c of FIG. 3 uses two pattern generators 320-1 and 320-2 but is capable of operating at the same operating speed as the 4-way ATE tester 20b of FIG. 2.

Although FIG. 3 illustrates an embodiment in which the two pattern generators 320-1 and 320-2 are used, the number of pattern generators may be set to an arbitrary integer that is equal to or greater than 3 in another embodiment.

A driver 330 may include a write driver 331 and a read driver 333. The write driver 331 may write the write data W_DATA to the DUT 30. The read driver 333 may read data R_DATA from the DUT 30.

A pattern comparator 340 may compare the write data W_DATA with the read data R_DATA to determine whether the DUT 30 operates normally or abnormally.

The pattern comparator 340 may output fail data F_DATA to a fail memory 350 that is a result of comparing the write data W_DATA with the read data R_DATA. The fail data F_DATA may be data regarding an error occurring when the DUT 30 operates abnormally.

Figure 4:
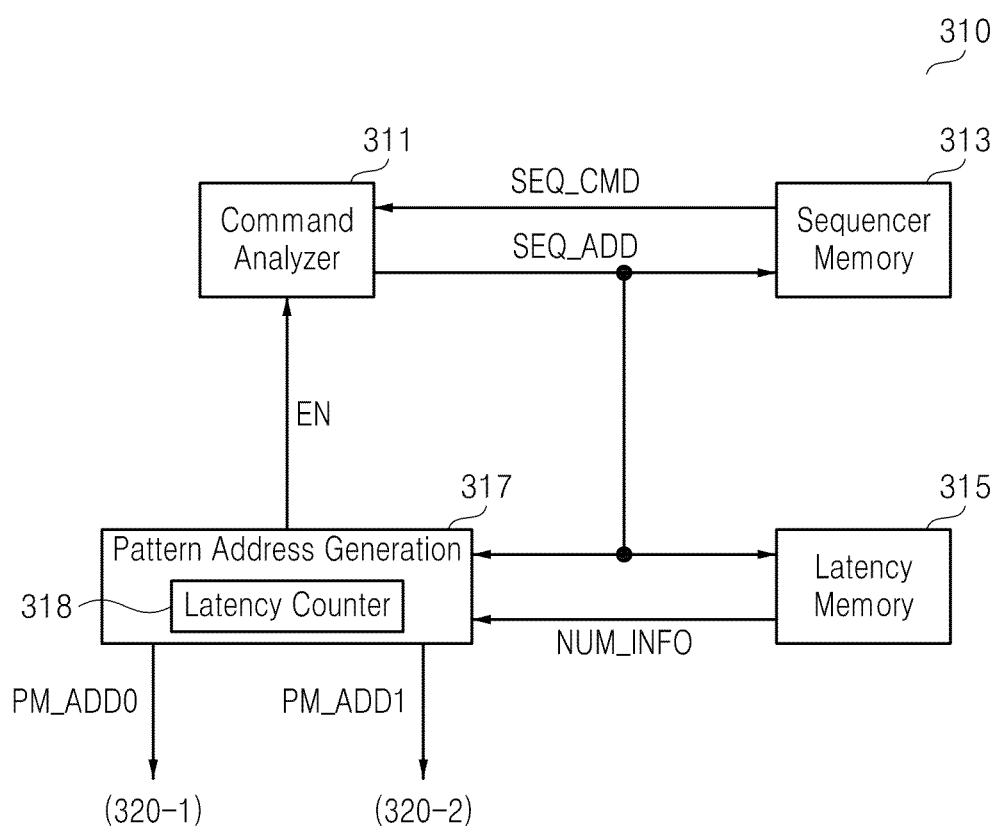
FIG. 4 is a block diagram of an embodiment of a variable sequencer illustrated in FIG. 3.

FIG. 4 is a block diagram of an embodiment of the variable sequencer 310 illustrated in FIG. 3.

Referring to FIGS. 3 and 4, the variable sequencer 310 may include a command analyzer 311, a sequencer memory 313, a latency memory 315, and a pattern address generator 317.

The sequencer memory 313 may store the sequencer command SEQ_CMD at the sequencer memory address SEQ_ADD. The command analyzer 311 may output a sequencer memory address SEQ_ADD, receive a sequencer command SEQ_CMD corresponding to the sequencer memory address SEQ_ADD from the sequencer memory 313, and execute the sequencer command SEQ_CMD.

The latency memory 315 may store pattern command number information NUM_INFO regarding the number of pattern commands corresponding to the sequencer memory address SEQ_ADD.

The pattern address generator 317 may generate pattern memory addresses, e.g., a first pattern memory address PM_ADD0 and a second pattern memory address PM_ADD1, based on the sequencer memory address SEQ_ADD and the number of pattern commands.

The pattern address generator 317 may include a latency counter 318 therein. The pattern address generator 317 may generate and output pattern memory addresses, the number of which is equal to the number of pattern commands by using the latency counter 318, and thereafter transmit an enable signal EN to the command analyzer 311.

The command analyzer 311 may update the sequencer memory address SEQ_ADD according to the sequencer command SEQ_CMD, and output the updated sequencer memory address SEQ_ADD according to the enable signal EN.

While the exemplary embodiment of FIG. 4 shows an architecture for variable sequencer 310 that includes a separate sequencer memory 313 and latency memory 315 that respectively provide the sequencer command SEQ_CMD and pattern command number information NUM_INFO to the command analyzer 311 and pattern address generator 317 to generate the first and second pattern memory addresses PM_ADD0 and PM_ADD1, in other embodiments a variable sequencer may generate the pattern memory addresses using different architectures. For example, a programmed circuit with lookup tables may be used, or a processor circuit can be programmed with algorithms that generate the desired pattern memory address outputs. In other embodiments the structures of the components of FIG. 4 can be combined into other circuits. For example, memories can be combined into a single memory, or a single circuit or such as a programmed logic circuit or a software based processor circuit that can implement the requisite features from the command analyzer and pattern address generator, etc.

FIG. 5 is a table showing examples of values stored in the sequencer memory 313 and the latency memory 315 illustrated in FIG. 4.

Referring to FIGS. 4 and 5, the number of pattern commands stored in the latency memory 315 may vary according to a sequencer memory address SEQ_ADD.

For example, the sequencer memory 313 may store a NOP0 command, a NOP1 command, and a LOOP command which are sequencer commands SEQ_CMD at a $0^{th}$ address, a $1^{st}$ address, and a $2^{nd}$ address among sequencer memory addresses SEQ_ADD, respectively.

The number of pattern commands corresponding to the $0^{th}$ address may be 6, the number of pattern commands corresponding to the $1^{st}$ address may be 5, and the number of pattern commands corresponding to the $2^{nd}$ address may be 4.

The latency memory 315 may store values obtained by subtracting 1 from the numbers of pattern commands, e.g., 5, 4, and 3, and output these values as the pattern command number information NUM_INFO. However, embodiments are not limited thereto.

The sequencer commands SEQ_CMD and the pattern command number information NUM_INFO may vary according to an external input, e.g., the code CODE received from the test PC 10 of FIG. 3.

Figure 6:
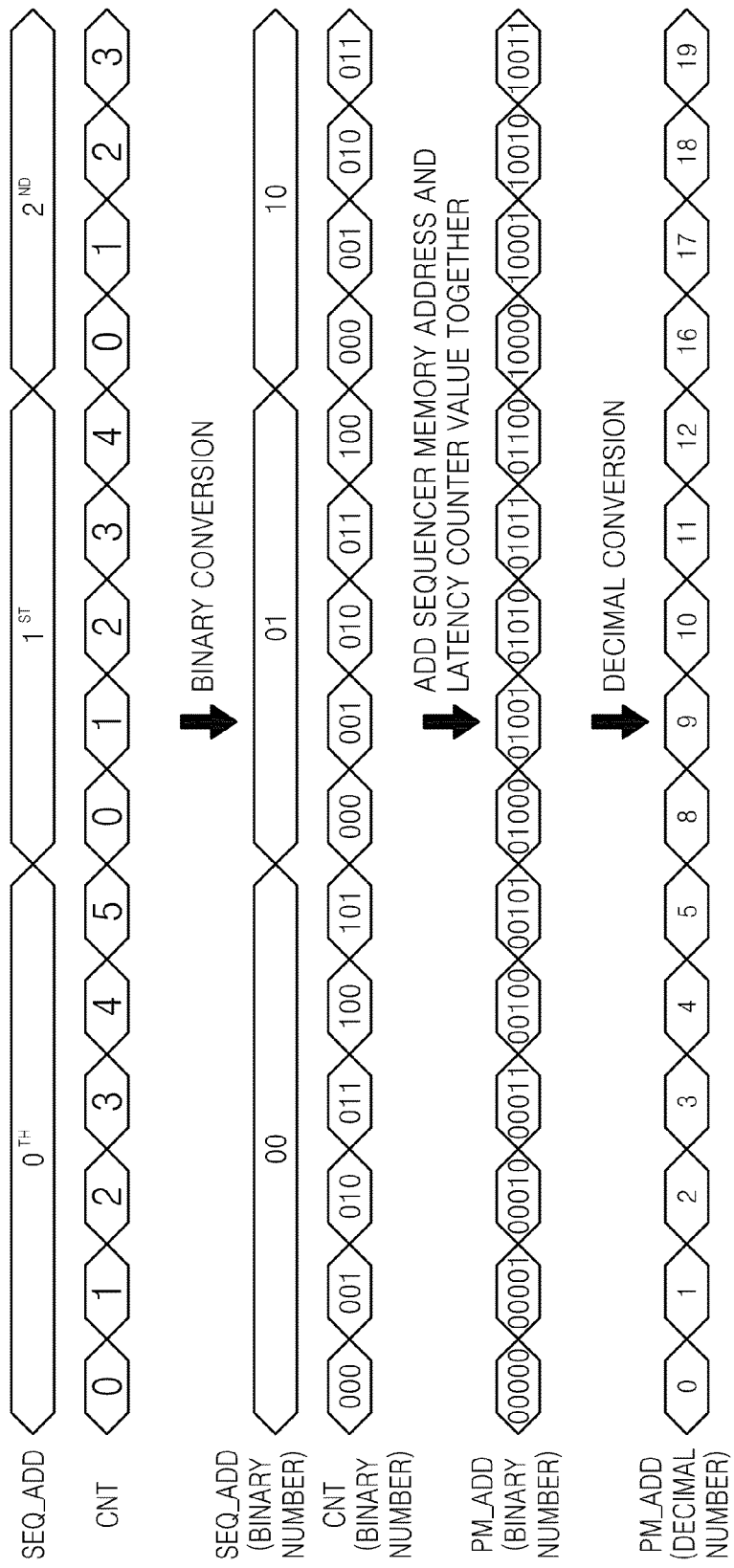
FIG. 6 illustrates an operation of a pattern address generator of FIG. 4.

FIG. 6 illustrates an operation of the pattern address generator 317 of FIG. 4.

Referring to FIGS. 4 to 6, the pattern address generator 317 receives the sequencer memory address SEQ_ADD from the command analyzer 311, and the pattern command number information NUM_INFO from the latency memory 315.

If the sequencer memory address SEQ_ADD is a $0^{th}$ address, the pattern command number information NUM_INFO is 5.

The latency counter 318 may sequentially count 0 to 5 and output them as count values CNT.

A result of converting the sequencer memory address SEQ_ADD into a binary number is 00. Results of converting the count values CNT counted by the latency counter 318 into binary numbers are 000 to 101.

The pattern address generator 317 may add the sequencer memory address SEQ_ADD and the count values CNT to generate a pattern memory address PM_ADD. For example, the first two digits of the pattern memory address PM_ADD that is five digits may be set as the sequencer memory address SEQ_ADD and the remaining three digits may be set as the count values CNT.

When the generated pattern memory address PM_ADD is converted into decimal numbers, $0^{th}$ address to a $5^{th}$ addresses are generated.

The pattern address generator 317 may transmit an enable signal EN to the command analyzer 311 after the five addresses are generated from the pattern memory address PM_ADD.

Since the sequencer command SEQ_CMD corresponding to the $0^{th}$ address is NOP0 when the sequencer memory address SEQ_ADD is the $0^{th}$ address, the command analyzer 311 may update the sequencer memory address SEQ_ADD from the $0^{th}$ address to the $1^{st}$ address. The command analyzer 311 may then output the $1^{st}$ address as the sequencer memory address SEQ_ADD according to the enable signal EN.

Thereafter, the process described above may be repeatedly performed.

Figure 7:
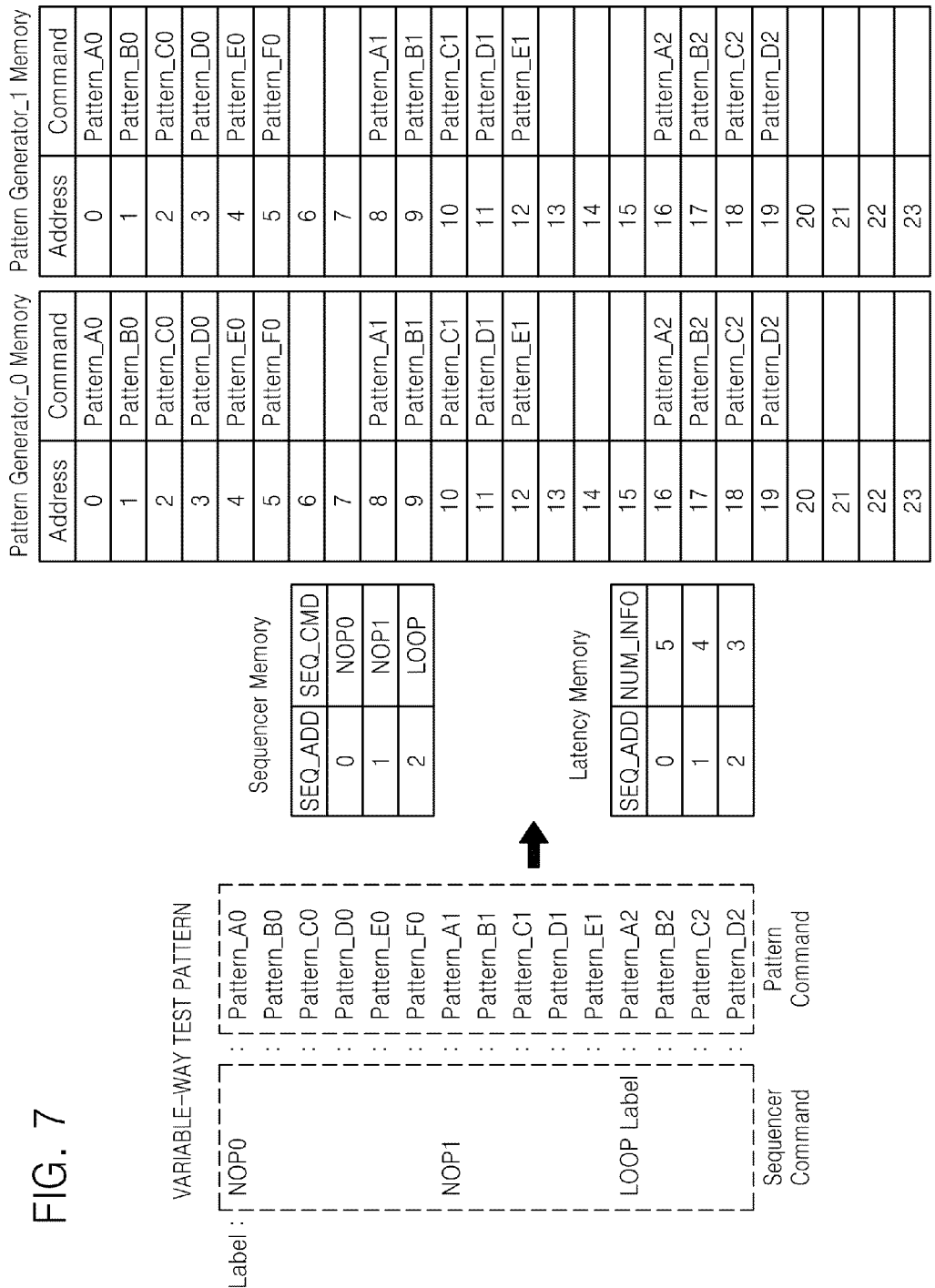
FIG. 7 illustrates a pattern storing method for the ATE tester of FIG. 3.

FIG. 7 illustrates a pattern storing method employed by the ATE tester 20c of FIG. 3.

Referring to FIGS. 3 to 7, a first sequencer command NOP0 stored at the $0^{th}$ address of the sequencer memory 313 may correspond to six pattern commands Pattern_A0, Pattern_B0, Pattern_C0, Pattern_D0, Pattern_E0, and Pattern_F0; a second sequencer command NOP1 stored at the $1^{st}$ address of the sequencer memory 313 may correspond to five pattern commands Pattern_A1, Pattern_B1, Pattern_C1, Pattern_D1, and Pattern_E1; and a third sequencer command LOOP stored at the $2^{nd}$ address of the sequencer memory 313 may correspond to four pattern commands Pattern_A2, Pattern_B2, Pattern_C2, and Pattern_D2.

The same test patterns may be stored in the first and second pattern memories 321-1 and 321-2. When the number of pattern commands is less than 7, each of the first and second pattern memories 321-1 and 321-2 may discontinuously store a plurality of test patterns.

That is, the first pattern commands Pattern_A0, Pattern_A1, and Pattern_A2 that are respectively allocated to the first sequencer command NOP0, the second sequencer command NOP1, and the third sequencer command LOOP which are sequencer commands SEQ_CMD may be stored at addresses corresponding to multiples of 8, e.g., a $0^{th}$ address, $8^{th}$ address, and $16^{th}$ address of a pattern memory.

When the numbers of pattern commands to be executed according to the sequencer commands SEQ_CMD, respectively, are 6, 5, and 4, the first six pattern commands Pattern_A0, Pattern_B0, Pattern_C0, Pattern_D0, Pattern_E0, and Pattern_F0 may be stored at the $0^{th}$ to $5^{th}$ addresses of the pattern memory; the second five pattern commands Pattern_A1, Pattern_B1, Pattern_C1, Pattern_D1, and Pattern_E1 may be stored at the $8^{th}$ to $12^{th}$ addresses of the pattern memory; and the last four pattern commands Pattern_A2, Pattern_B2, Pattern_C2, and Pattern_D2 may be stored at the $16^{th}$ to $19^{th}$ addresses of the pattern memory.

That is, there is no constraint on the number of pattern commands to be executed for each sequencer command according to various embodiments. Thus, a test pattern may be prepared in a form that a user desires, and a cycle of executing pattern commands may be controlled in an arbitrary unit of a clock, allowing for flexibility in ATE similar to what is possible in mount testing.

Figure 8:
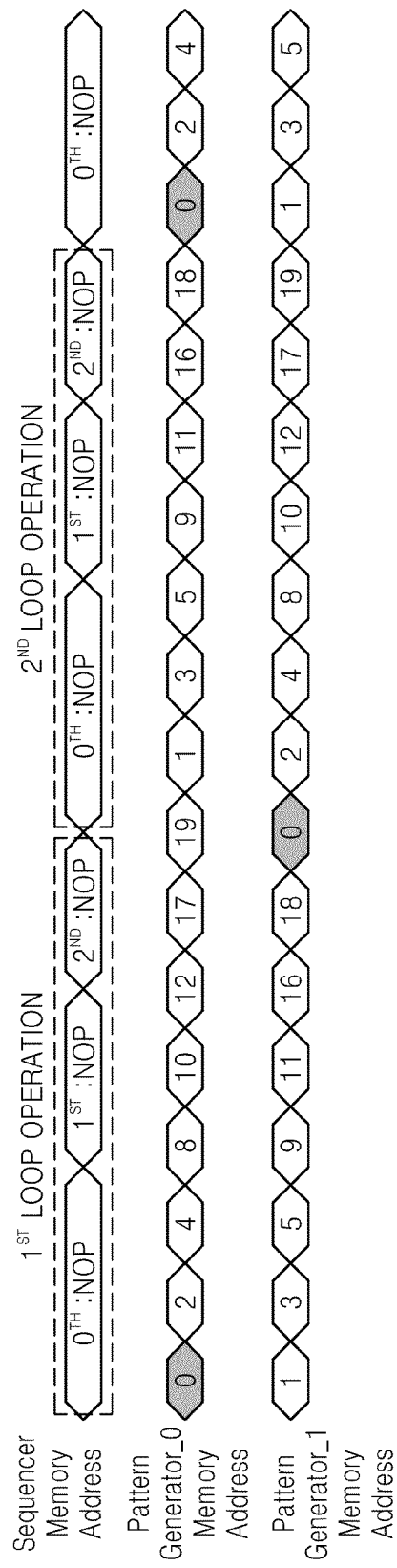
FIG. 8 illustrates examples of a first pattern memory address and a second pattern memory address of FIG. 3.

FIG. 8 illustrates the first and second pattern memory addresses PM_ADD0 and PM_ADD1 of FIG. 3.

Referring to FIGS. 3, 4 and 6 to 8, the pattern address generator 317 of variable sequencer 310 may output two pattern memory addresses as first pattern memory addresses PM_ADD0 and second pattern memory addresses PM_ADD1 among generated pattern memory addresses PM_ADD.

In this case, if the number of whole pattern commands present in a loop command is an odd number when repetitive commands such as a loop are performed, a location of a pattern generator that executes each of the pattern commands may be repeatedly changed.

For example, the pattern command Pattern_A0 stored at $0^{th}$ addresses of the pattern memories 321-1 and 321-2 may be executed by the first pattern generator 320-1 in a first loop, and executed by the pattern generator 320-2 in a second loop.

Figure 9B:
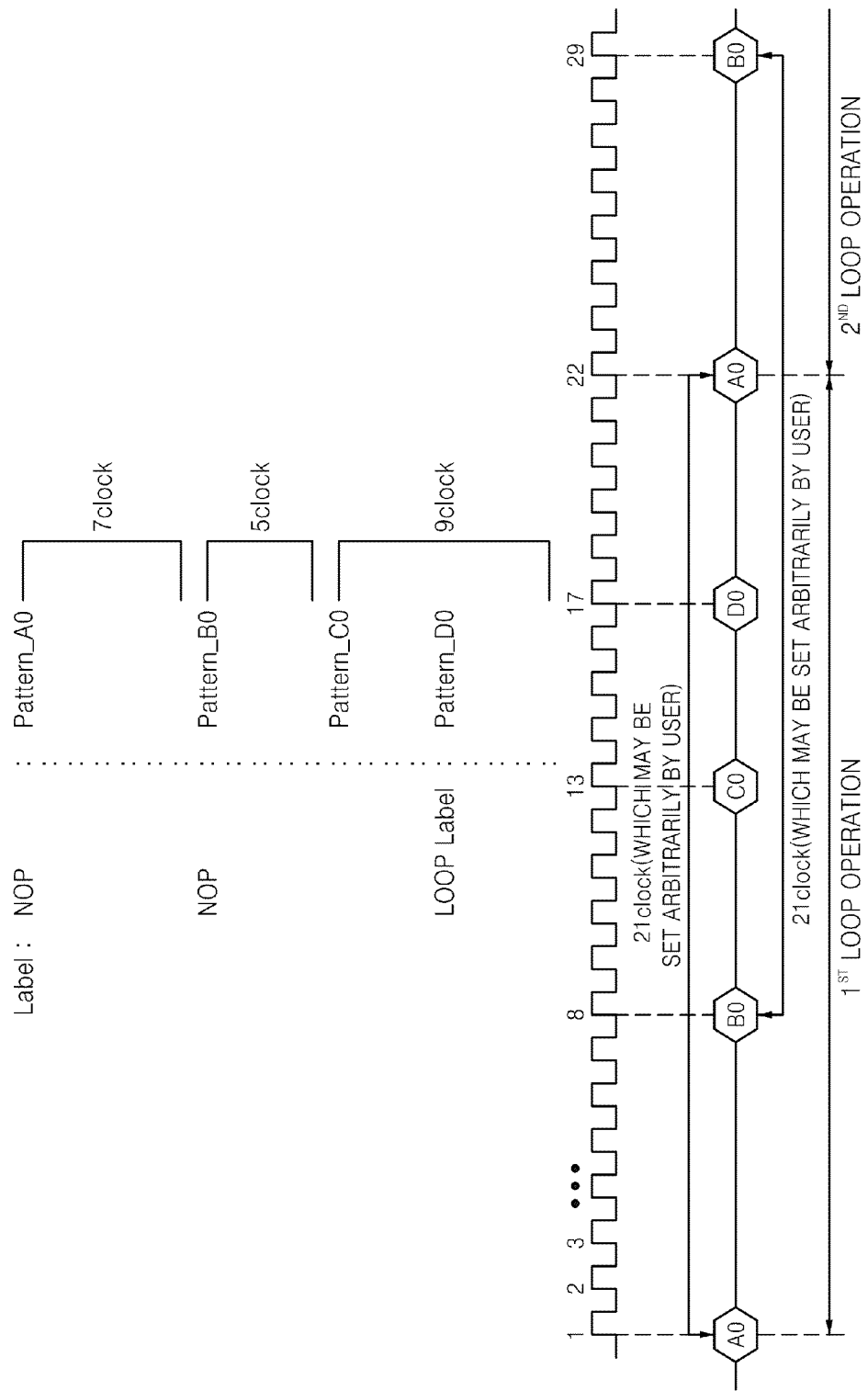
FIG. 9B illustrates a cycle of executing pattern commands according to a test pattern of the ATE tester of FIG. 3.

FIG. 9A illustrates a cycle of executing pattern commands according to a test pattern of the 4-way ATE tester 20b of FIG. 2A. FIG. 9B illustrates a cycle of executing pattern commands according to a test pattern of the ATE tester 20c of FIG. 3.

Referring to FIGS. 2A, 3, 9A, and 9B, in the case of the 4-way ATE tester 20b, the number of pattern commands to be executed for each sequencer command is fixed to 4 and thus a repetitive cycle of executing pattern commands present in a loop operation is always fixed to a multiple of 4.

That is, a repetitive cycle of executing pattern commands Pattern_A0, Pattern_B0, Pattern_C0, and Pattern_D0 is always fixed to a multiple of 4 such as twenty clock cycles as shown in FIG. 9A.

In contrast, in the case of the ATE tester 20c according to an embodiment of the inventions, the number of pattern commands to be executed for each sequencer command is not fixed. Thus, a repetitive cycle of executing pattern commands may be arbitrarily set to a value other than a multiple of 4 according to a test pattern that a user prepares.

As shown in FIG. 9B, if the number of pattern commands corresponding to a first sequencer command NOP is set to 7, the number of pattern commands corresponding to a second sequencer command NOP is set to 5, and the number of pattern commands corresponding to a third sequencer command LOOP is set to 9, then a repetitive cycle of executing the pattern commands Pattern_A0, Pattern_B0, Pattern_C0, and Pattern_D0 is twenty-one clocks.

A repetitive cycle of executing pattern commands may be adjusted by adjusting the sequencer command or the number of pattern commands by using a test PC. Accordingly, an ATE test pattern may be adapted to be identical to a test pattern in a mount test environment, and a range of an ATE test may be expanded to obtaining improved test coverage.

Figure 10:
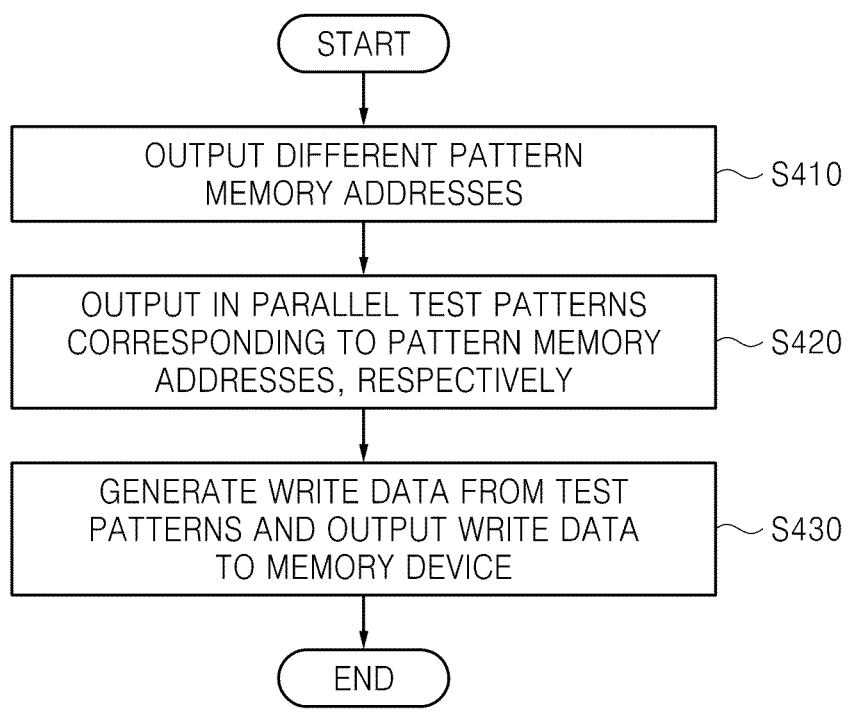
FIG. 10 is a flowchart of a method of operating a memory test device according to an embodiment.

FIG. 10 is a flowchart of a method of operating a memory test device according to an embodiment.

Referring to FIGS. 3, 4, and 10, the test PC 10 may transmit code CODE to the tester 20c to set the memories 313, 315, 321-1, and 321-2 of the sequencer 310 and the pattern generators 320-1 and 320-2 included in the tester 20c.

Thereafter, when the test PC 10 outputs a test start signal START to the tester 20c, the tester 20c may perform a test operation as described below.

The variable sequencer 310 may output different pattern memory addresses PM_ADD0 and PM_ADD1 (operation S410).

The outputting of the different pattern memory addresses PM_ADD0 and PM_ADD1 may include extracting the number of pattern commands corresponding to a sequencer memory address SEQ_ADD, and generating the pattern memory addresses PM_ADD0 and PM_ADD1 according to the sequencer memory address SEQ_ADD and the number of the pattern commands. The number of pattern commands may vary according to the sequencer memory address SEQ_ADD.

Then, the first pattern generator 320-1 and the second pattern generator 320-2 may output in parallel test patterns PTN_0 and PTN_1 corresponding to the pattern memory addresses PM_ADD0 and PM_ADD1, respectively (operation S420).

Then, the write data generator 360 may select from the test patterns PTN_0 and PTN_1 an appropriate test pattern and generate write data W_DATA for output to the DUT 30 (operation S430).

Thereafter, the tester 20c reads read data R_DATA from the DUT 30, and compares the write data W_DATA with the read data R_DATA to determine whether the DUT 30 operates normally.

According to the one or more embodiments of the inventions, not only pattern generators may be employed in parallel to test a memory at a high speed but also the number of pattern commands to be executed for each sequence command is variable, thereby expanding test coverage of a memory test device.

While aspects of the inventions have been described with reference to exemplary embodiments, it will be understood that various changes in form and details may be made therein without departing from the spirit and scope of the following claims.

What is claimed is:

1. A memory test device for testing a memory device, the memory test device comprising:
    a sequencer configured to generate first and second sequencer outputs that are different from each other based on a sequencer address and a number of pattern commands corresponding to the sequencer address;
    a first pattern generator coupled to the sequencer and configured to output a first test pattern according to the first sequencer output;
    a second pattern generator coupled to the sequencer and configured to output a second test pattern according to the second sequencer output; and
    a selector coupled to the first and second pattern generators and configured to output write data according to the first test pattern and the second test pattern.

2. The memory test device of claim 1, wherein the first pattern generator and the second pattern generator are configured to operate in parallel.

3. The memory test device of claim 1, wherein same test patterns are stored in the first pattern generator and the second pattern generator.

4. The memory test device of claim 1, wherein the first and second sequencer outputs are first and second pattern memory addresses, and the sequencer comprises:
    a command analyzer configured to receive and execute a sequencer command; and
    a pattern address generator configured to generate the first and second pattern memory addresses.

5. The memory test device of claim 4, further comprising:
    a sequencer memory configured to store the sequencer command; and
    a latency memory configured to store information related to the number of pattern commands, and
    wherein the pattern address generator is configured to generate the first and second pattern memory addresses according to the sequencer memory address and the number of pattern commands.

6. The memory test device of claim 5, wherein the number of pattern commands varies according to the sequencer memory address.

7. The memory test device of claim 5, wherein the pattern address generator is configured to output a number of pattern memory addresses equal to the number of the pattern commands, and to transmit an enable signal to the command analyzer, and
    the command analyzer is configured to update the sequencer memory address according to the sequencer command and to output the updated sequencer memory address according to the enable signal.

8. The memory test device of claim 5, wherein each of the first pattern generator and the second pattern generator is configured to discontinuously store a plurality of test patterns when a number of pattern commands is less than 7.

9. The memory test device of claim 5, wherein the sequencer is configured to store in the latency memory a value obtained by subtracting 1 from the number of the pattern commands.

10. The memory test device of claim 4, wherein the sequencer command varies according to an external input.

11. The memory test device of claim 5, wherein the number of the pattern commands varies according to an external input.

12. The memory test device of claim 1, further comprising a pattern comparator configured to compare data read from the memory device with the write data to determine whether the memory device operates normally.

13. A method of operating a memory test device to test a memory device, the method comprising:
    extracting a number of pattern commands corresponding to a sequencer memory address, wherein the number of the pattern commands varies based on the sequencer memory address;
    generating a plurality of pattern memory addresses based on the sequencer memory address and the number of the pattern commands;
    outputting in parallel the plurality of pattern memory addresses to a plurality of pattern generators;
    outputting in parallel from the plurality of pattern generators a plurality of test patterns that correspond to the plurality of different sequencer outputs;
    generating write data according to the plurality of test patterns; and
    outputting the write data to the memory device.

14. The method of claim 13, further comprising:
    reading read data from the memory device; and
    comparing the write data with the read data to determine whether the memory device operates normally.

15. A memory test system comprising:
    a host configured to control a memory test device;
    a sequencer coupled to the host and configured to generate first and second sequencer outputs that are different from each other based on a sequencer address and a number of pattern commands corresponding to the sequencer address;
    first and second pattern generators coupled to the sequencer and configured to provide respective first and second pattern outputs based on the first and second sequencer outputs, respectively; and
    a selector coupled to the first and second pattern generators and configured to provide output write data based on the first and second pattern outputs.

16. The memory test system of claim 15, wherein the sequencer comprises a command analyzer configured to receive and execute a sequencer command and a pattern address generator configured to generate the first and second sequencer outputs.

17. The memory test system of claim 16, wherein the sequencer further comprises a sequencer memory configured to store the sequencer command and a latency memory configured to store information related to a number of pattern commands.

18. The memory test system of claim 17, wherein the pattern address generator is configured to generate first and second pattern memory addresses according to a sequencer memory address and the number of pattern commands.

19. The method of claim 13, wherein the generating the write data comprises:
   selecting a test pattern from the plurality of test patterns.

20. The method of claim 13, wherein the generating the write data comprises:
   executing pattern commands corresponding to the different pattern memory addresses.

\* \* \* \* \*